(12) United States Patent
Garner et al.

(10) Patent No.: US 6,938,680 B2
(45) Date of Patent: Sep. 6, 2005

(54) TOWER HEAT SINK WITH SINTERED GROOVED WICK

(75) Inventors: Scott D. Garner, Lititz, PA (US); James E. Lindemuth, Lititz, PA (US); Jerome E. Toth, Hatboro, PA (US); John H. Rosenfeld, Lancaster, PA (US); Kenneth G. Minnerly, Lititz, PA (US)

(73) Assignee: Thermal Corp., Stanton, DE (US)

( * ) Notice: Subject to any disclaimer, the term of this patent is extended or adjusted under 35 U.S.C. 154(b) by 64 days.

(21) Appl. No.: 10/618,965

(22) Filed: Jul. 14, 2003

(65) Prior Publication Data

US 2005/0011633 A1 Jan. 20, 2005

(51) Int. Cl.[7] ............................................... F28D 15/00
(52) U.S. Cl. ........................... 165/104.26; 165/104.33; 165/80.4; 361/700; 257/715
(58) Field of Search ....................... 165/104.26, 104.21, 165/104.33, 80.4, 185; 361/699, 700; 257/714–716; 174/15.2

(56) References Cited

U.S. PATENT DOCUMENTS

| | | | |
|---|---|---|---|
| 3,537,514 A | | 11/1970 | Levedahl |
| 3,598,108 A | * | 8/1971 | Moore, Jr. .................. 165/133 |
| 3,613,778 A | | 10/1971 | Feldman, Jr. |

(Continued)

FOREIGN PATENT DOCUMENTS

| | | | | |
|---|---|---|---|---|
| JP | 60-42593 | * | 3/1985 | ............ 165/104.26 |

OTHER PUBLICATIONS

Rosenfeld, J.H., "Nucleate Boiling Heat Transfer in Porous Wick Structures," ASME HTD vol. 108, *Heat Transfer Fundamentals, Design, Applications, and Operating Problems*, R.H. Shah, Ed., pp. 47–55, 1989.

Rosenfeld, J.H. and J.E. Lindemuth, "Acetone Heat Pipes for Stirling Orbiter Refrigerator/Freezer," Contract G350240J70—final report to GE Gov't. Service, Apr. 16, 1993.

McDonald, K.E., Berchowitz, D., Rosenfeld, J.H., and Lindemuth, J.E., "Stirling Refrigerator for Space Shuttle Experiments," Proc. 29th IECEC, paper 94–4179, pp. 1807–1812, 1994.

Lindemuth, J.E., "Stainless Steel/Propylene Heat Pipe Interface for Stirling Orbiter Refrigerator/Freezer," NASA LeRC final report, PO. No. C–76546–F, Apr. 21, 1998.

Rosenfeld, J.H. and Lindemuth, J.E., "Heat Transfer in Sintered Groove Heat Pipes," International Heat Pipe Conference, 1999.

Rosenfeld, J.H. and North, M.T., "Porous Media Heat Exchangers for Cooling of High–Power Optical Components," *Optical Engineering*, vol. 34, No. 2, pp. 335–341, Feb. 1995.

Rosenfeld, J.H., Toth, J.E., and Phillips, A.L., "Emerging Applications for Porous Media Heat Exchangers," Proc. Int. Conf. on Porous Media and Their Applications in Science, Eng., and Industry, Kona, HI, Jun. 16–21, 1996.

*Primary Examiner*—Terrell McKinnon
(74) *Attorney, Agent, or Firm*—Duane Morris LLP

(57) ABSTRACT

A heat pipe is provided having a tubular enclosure with an internal surface, a working fluid disposed within the enclosure, and at least one fin projecting radially outwardly from an outer surface of the tubular enclosure. The tubular enclosure is sealed at one end by a base having a grooved sintered wick disposed on at least a portion of its internally facing surface. The grooved, sintered wick comprises a plurality of individual particles having an average diameter. The grooved wick includes at least two adjacent lands that are in fluid communication with one another through a particle layer disposed between said at least two adjacent lands that comprises less than about six average particle diameters.

11 Claims, 6 Drawing Sheets

U.S. PATENT DOCUMENTS

| | | | |
|---|---|---|---|
| 3,675,711 A | 7/1972 | Bilinski et al. | |
| 3,681,843 A | 8/1972 | Arcella et al. | |
| 3,788,388 A | 1/1974 | Barkmann | |
| 4,042,316 A | 8/1977 | Rabe | |
| 4,046,190 A | 9/1977 | Marcus et al. | |
| 4,118,756 A | 10/1978 | Nelson et al. | |
| 4,177,646 A | 12/1979 | Guadagnin et al. | |
| 4,231,423 A | 11/1980 | Haslett | |
| 4,274,479 A * | 6/1981 | Eastman | 165/104.26 |
| 4,279,479 A | 7/1981 | Schrier | |
| 4,327,752 A | 5/1982 | Hickel | |
| 4,354,482 A | 10/1982 | Beisecker | |
| 4,361,133 A | 11/1982 | Bonnema | |
| 4,365,851 A | 12/1982 | Andres et al. | |
| 4,366,526 A | 12/1982 | Lijoi et al. | |
| 4,374,528 A | 2/1983 | Tittert | |
| 4,382,448 A | 5/1983 | Tittert | |
| 4,489,777 A | 12/1984 | Del Bagno et al. | |
| 4,503,483 A | 3/1985 | Basiulis | |
| 4,557,413 A | 12/1985 | Lewis et al. | |
| 4,616,699 A | 10/1986 | Grote | |
| 4,641,404 A | 2/1987 | Seydel et al. | |
| 4,697,205 A | 9/1987 | Eastman | |
| 4,748,314 A | 5/1988 | Desage | |
| 4,765,396 A | 8/1988 | Seidenberg | |
| 4,777,561 A | 10/1988 | Murphy et al. | |
| 4,807,697 A | 2/1989 | Gernert et al. | |
| 4,819,719 A | 4/1989 | Grote et al. | |
| 4,830,097 A | 5/1989 | Tanzer | |
| 4,840,224 A | 6/1989 | Dietzsch | |
| 4,865,729 A | 9/1989 | Saxena et al. | |
| 4,880,052 A | 11/1989 | Meyer, IV et al. | |
| 4,883,116 A | 11/1989 | Seidenberg et al. | |
| 4,885,129 A | 12/1989 | Leonard et al. | |
| 4,912,548 A | 3/1990 | Shanker et al. | |
| 4,921,041 A | 5/1990 | Akachi | |
| 4,929,414 A | 5/1990 | Leonard et al. | |
| 4,931,905 A | 6/1990 | Cirrito et al. | |
| 4,960,202 A | 10/1990 | Rice et al. | |
| 4,982,274 A | 1/1991 | Murase et al. | |
| 5,059,496 A | 10/1991 | Sindorf | |
| 5,076,352 A | 12/1991 | Rosenfeld et al. | |
| 5,101,560 A | 4/1992 | Leonard et al. | |
| 5,103,897 A | 4/1992 | Cullimore et al. | |
| 5,148,440 A | 9/1992 | Duncan | |
| 5,160,252 A | 11/1992 | Edwards | |
| 5,200,248 A | 4/1993 | Thompson et al. | |
| 5,219,020 A | 6/1993 | Akachi | |
| 5,242,644 A | 9/1993 | Thompson et al. | |
| 5,253,702 A | 10/1993 | Davidson et al. | |
| 5,268,812 A | 12/1993 | Conte | |
| 5,283,715 A | 2/1994 | Carlsten et al. | |
| 5,320,866 A | 6/1994 | Leonard | |
| 5,331,510 A | 7/1994 | Ouchi et al. | |
| 5,333,470 A | 8/1994 | Dinh | |
| 5,349,237 A | 9/1994 | Sayka et al. | |
| 5,408,128 A | 4/1995 | Furnival | |
| 5,409,055 A | 4/1995 | Tanaka et al. | |
| 5,412,535 A * | 5/1995 | Chao et al. | 361/700 |
| 5,522,455 A | 6/1996 | Brown et al. | |
| 5,549,394 A | 8/1996 | Nowak et al. | |
| 5,582,242 A * | 12/1996 | Hamburgen et al. | 165/104.21 |
| 5,632,158 A * | 5/1997 | Tajima | 62/259.2 |
| 5,642,776 A * | 7/1997 | Meyer et al. | 165/104.26 |
| 5,664,890 A | 9/1997 | Nowak et al. | |
| 5,711,816 A | 1/1998 | Kirlin et al. | |
| 5,769,154 A | 6/1998 | Adkins et al. | |
| 5,826,645 A | 10/1998 | Meyer, IV et al. | |
| 5,847,925 A | 12/1998 | Progl et al. | |
| 5,880,524 A | 3/1999 | Xie | |
| 5,883,426 A | 3/1999 | Tokuno et al. | |
| 5,947,193 A | 9/1999 | Adkins et al. | |
| 5,950,710 A | 9/1999 | Liu | |
| 6,041,211 A | 3/2000 | Hobson et al. | |
| 6,055,157 A | 4/2000 | Bartilson | |
| 6,056,044 A | 5/2000 | Benson et al. | |
| 6,082,443 A | 7/2000 | Yamamoto et al. | |
| 6,148,906 A | 11/2000 | Li et al. | |
| 6,154,364 A | 11/2000 | Girrens et al. | |
| 6,158,502 A | 12/2000 | Thomas | |
| 6,167,948 B1 | 1/2001 | Thomas | |
| 6,169,852 B1 | 1/2001 | Liao et al. | |
| 6,227,287 B1 * | 5/2001 | Tanaka et al. | 165/80.4 |
| 6,230,407 B1 | 5/2001 | Akutsu | |
| 6,239,350 B1 | 5/2001 | Sievers et al. | |
| 6,256,201 B1 | 7/2001 | Ikeda et al. | |
| 6,293,333 B1 | 9/2001 | Ponnappan et al. | |
| 6,302,192 B1 | 10/2001 | Dussinger et al. | |
| 6,303,081 B1 | 10/2001 | Mink et al. | |
| 6,382,309 B1 | 5/2002 | Kroliczek et al. | |
| 6,388,882 B1 | 5/2002 | Hoover et al. | |
| 6,397,935 B1 | 6/2002 | Yamamoto et al. | |
| 6,418,017 B1 | 7/2002 | Patel et al. | |
| 6,536,510 B2 * | 3/2003 | Khrustalev et al. | 165/104.33 |
| 6,725,909 B1 * | 4/2004 | Luo | 165/104.21 |
| 6,793,009 B1 * | 9/2004 | Sarraf | 165/104.33 |

* cited by examiner

TOWER HEAT SINK WITH SINTERED GROOVED WICK

FIELD OF THE INVENTION

The present invention generally relates to the management of thermal energy generated by electronic systems, and more particularly to a heat pipe-related tower heat sink for efficiently and cost effectively routing and controlling the thermal energy generated by various components of an electronic system.

BACKGROUND OF THE INVENTION

Semiconductors are continuously diminishing in size. Corresponding to this size reduction is an increase in the power densities of semiconductors. This, in turn, creates heat proliferation problems which must be resolved because excessive heat will degrade semiconductor performance. Heat pipes are known in the art for both transferring and spreading heat that is generated by electronic devices.

Heat pipes use successive evaporation and condensation of a working fluid to transport thermal energy from a heat source to a heat sink. Heat pipes can transport very large amounts of thermal energy in a vaporized working fluid, because most working fluids have a high heat of vaporization. Further, the thermal energy can be transported over relatively small temperature differences between the heat source and the heat sink. Heat pipes generally use capillary forces created by a porous wick to return condensed working fluid, from a heat pipe condenser section (where transported thermal energy is given up at the heat sink) to an evaporator section (where the thermal energy to be transported is absorbed from the heat source).

Heat pipe wicks are typically made by wrapping metal screening of felt metal around a cylindrically shaped mandrel, inserting the mandrel and wrapped wick inside a heat pipe container and then removing the mandrel. Wicks have also been formed by depositing a metal powder onto the interior surfaces of the heat pipe and then sintering the powder to create a very large number of intersticial capillaries. Typical heat pipe wicks are particularly susceptible to developing hot spots where the liquid condensate being wicked back to the evaporator section boils away and impedes or blocks liquid movement. Heat spreader heat pipes can help improve heat rejection from integrated circuits. A heat spreader is a thin substrate that absorbs the thermal energy generated by, e.g., a semiconductor device, and spreads the energy over a large surface of a heat sink.

Ideally, a wick structure should be thin enough that the conduction delta-T is sufficiently small to prevent boiling from initiating. Thin wicks, however, have not been thought to have sufficient cross-sectional area to transport the large amounts of liquid required to dissipate any significant amount of power. For example, the patent of G. Y. Eastman, U.S. Pat. No. 4,274,479, concerns a heat pipe capillary wick structure that is fabricated from sintered metal, and formed with longitudinal grooves on its interior surface. The Eastman wick grooves provide longitudinal capillary pumping while the sintered wick provides a high capillary pressure to fill the grooves and assure effective circumferential distribution of the heat transfer liquid. Eastman describes grooved structures generally as having "lands" and "grooves or channels". The lands are the material between the grooves or channels. The sides of the lands define the width of the grooves. Thus, the land height is also the groove depth. Eastman also states that the prior art consists of grooved structures in which the lands are solid material, integral with the casing wall, and the grooves are made by various machining, chemical milling or extrusion processes.

Significantly, Eastman suggests that in order to optimize heat pipe performance, his lands and grooves must be sufficient in size to maintain a continuous layer of fluid within a relatively thick band of sintered powder connecting the lands and grooves such that a reservoir of working fluid exists at the bottom of each groove. Thus, Eastman requires his grooves to be blocked at their respective ends to assure that the capillary pumping pressure within the groove is determined by its narrowest width at the vapor liquid interface. In other words, Eastman suggests that these wicks do not have sufficient cross-sectional area to transport the relatively large amounts of working fluid that is required to dissipate a significant amount of thermal energy.

SUMMARY OF THE INVENTION

The present invention provides a tower heat pipe comprising a tubular enclosure having an internal surface at least partially covered with a wick, a working fluid disposed within the enclosure, and at least one fin projecting radially outwardly from an outer surface of the tubular enclosure. The tubular enclosure is sealed at one end by a base having a grooved sintered wick disposed on at least a portion of its internal surface. The grooved, sintered wick comprises a plurality of individual particles having an average diameter. The grooved wick includes at least two lands that are in fluid communication with one another through a particle layer disposed between the at least two lands that comprises less than about six average particle diameters.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein.

DETAILED DESCRIPTION OF THE PREFERRED EMBODIMENT

Figure 1:
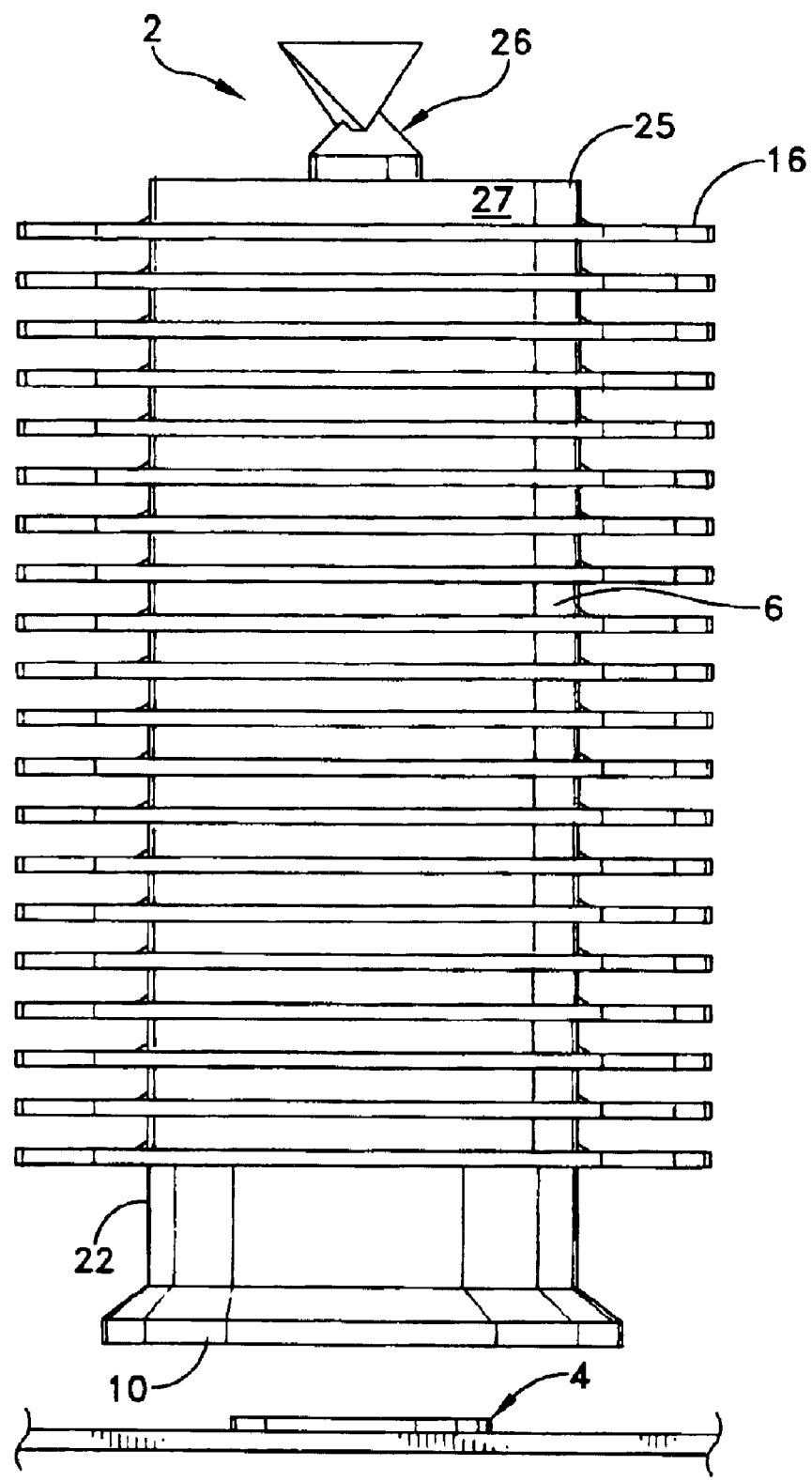
FIG. 1 is a front elevational view of a tower heat pipe formed in accordance with the present invention.

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. In the claims, means-plus-function clauses are intended to cover the structures described, suggested, or rendered obvious by the written description or drawings for performing the recited function, including not only structural equivalents but also equivalent structures.

Figure 2:
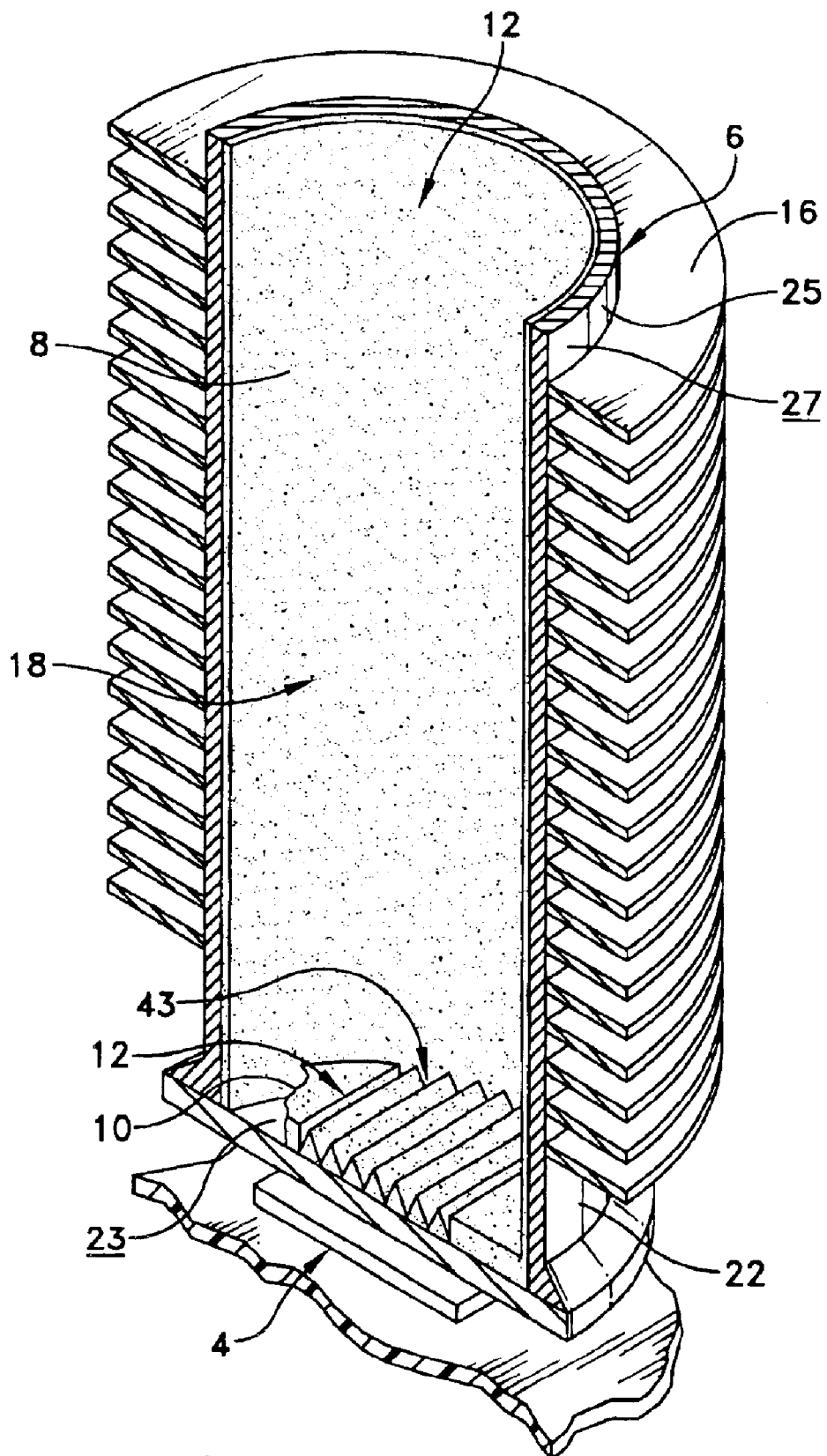
FIG. 2 is a cross-sectional perspective view of the tower heat pipe shown in FIG. 1.
Figure 3:
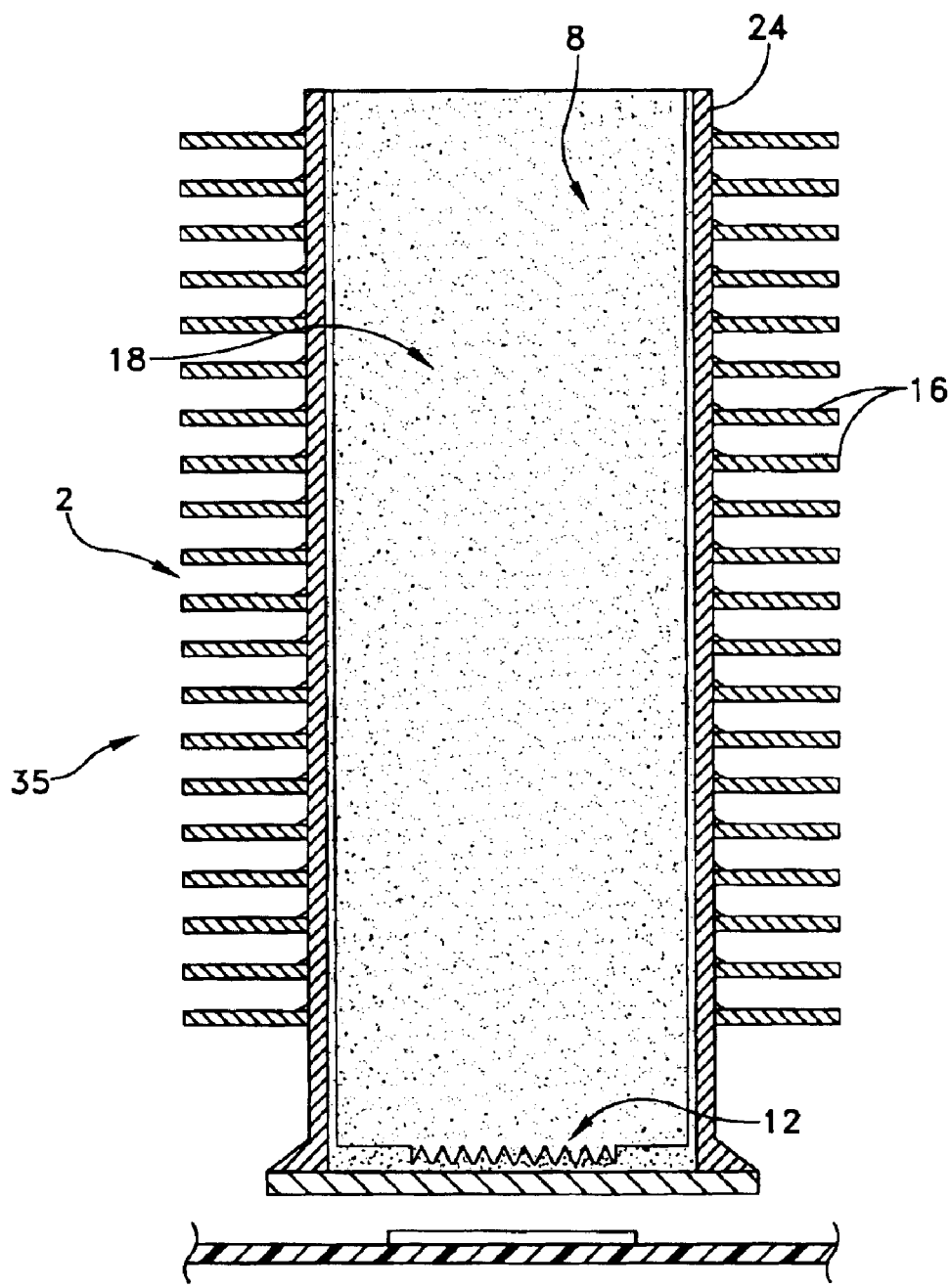
FIG. 3 is an elevational cross-sectional view of the tower heat pipe shown in FIGS. 1 and 2.
Figure 4:
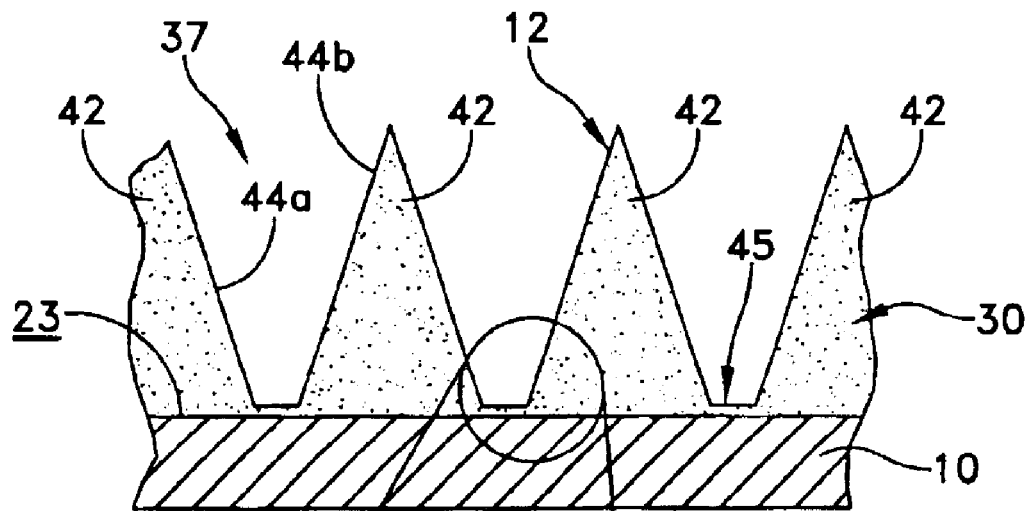
FIG. 4 is a broken-way, enlarged view of a portion of a base-wick shown in FIGS. 2 and 3.
Figure 5:
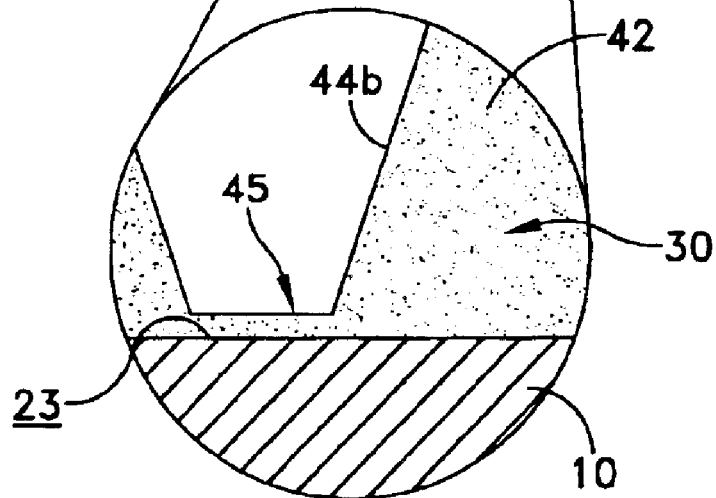
FIG. 5 is a significantly enlarged view of a portion of a groove-wick disposed at the bottom of the heat pipe of FIGS. 1–3, showing an extremely thin wick structure disposed between individual lands of the wick.
Figure 6:
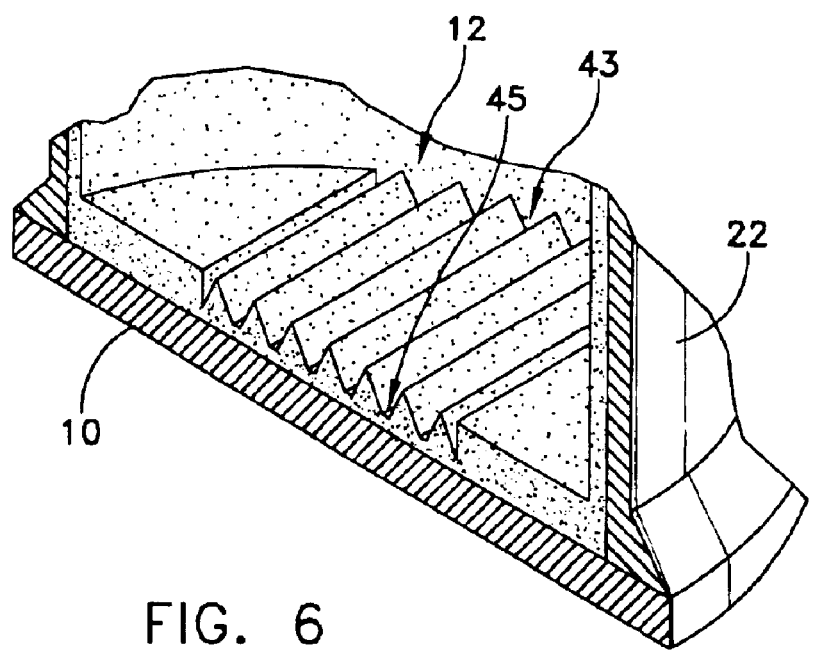
FIG. 6 is a broken-away end portion of a base-wick and base formed in accordance with the present invention.

Referring to FIGS. 1 and 2, the present invention comprises a tower heat pipe heat 2 that is sized and shaped to transfer thermal energy generated by at least one thermal energy source, e.g., a semiconductor device 4 that is thermally engaged with a portion of tower heat pipe 2. Heat pipe 2 includes a body 6, a body-wick 8, a base 10, a base-wick 12, and fins 16. More particularly, body 6 comprises a cylindrical tube formed from a highly thermally conductive metal, e.g., copper or its alloys, nickel or its alloys (such as monel an alloy of nickel and copper) could be incorporated into the structure with no significant changes in design or fabrication method. A vapor space is defined by a central passageway 18 extending along the longitudinal axis of body 6. Body 6 includes a bottom end 22 and a top end 25. Bottom end 22 is hermetically sealed to an inner surface 23 of base 10. Top end 25 is pinched off or otherwise sealed at a fill tube 26 during construction. Fins 16 project radially outwardly from outer surface 27 of body 6. Fins 16 may be formed from any thermally conductive material, such as copper, aluminum, or their alloys.

Referring to FIG. 2, body-wick 8 is preferably formed from a sintered copper powder or the like, that is distributed throughout the inner surface of body 6 that defines central passageway 18. Although not preferred, body-wick 8 may also comprise adjacent layers of screening or a sintered powder structure with interstices between the particles of powder, having an average thickness of about 0.1 mm to 1.0 mm. Additionally, central passageway 18 may be devoid of some or all of body-wick 8, particularly in gravity-aided embodiments of the invention.

Figure 7:
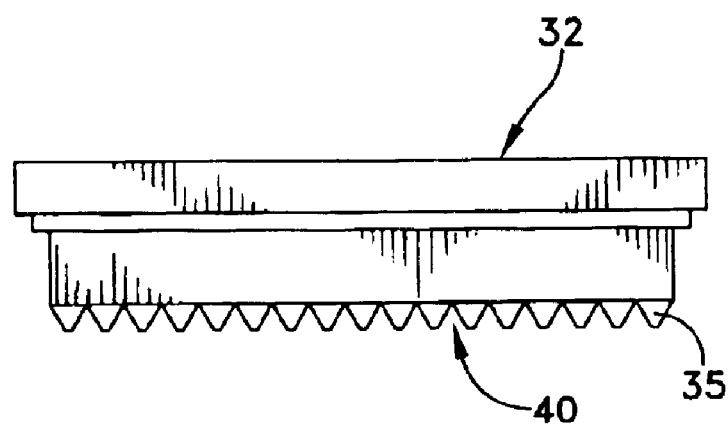
FIG. 7 is a perspective view of a typical mandrel used to form a base-wick in accordance with the present invention.

Referring to FIGS. 2–6, base-wick 12 is located on inner surface 23 of base 10, and is often formed from a metal powder 30 that is sintered in place around a shaped mandrel 32 (FIG. 7) to form a sintered groove structure. Lands 35 of mandrel 32 form grooves 37 of finished base-wick 12, and grooves 40 of mandrel 32 form lands 42 of base-wick 12. Each land 42 is formed as an inverted, substantially "V"-shaped or pyramidal protrusion having sloped side walls 44a, 44b, and is spaced-apart from adjacent lands. Grooves 37 separate lands 42 and are arranged in substantially parallel rows that extend through a portion of inner surface 23. The terminal portions 43 of grooves 37 may be disposed adjacent to the inner surface of bottom end 22 of body 6, or may be spaced away from body 6.

Advantageously, a relatively thin layer of sintered powder 30 is deposited upon inner surface 23 of base 10 so as to form a groove-wick 45 at the bottom of each groove 37, and between spaced-apart lands 42. When base-wick 12 is arranged in spaced-away relation to the inner surface of bottom end 22 of body 6, groove-wick 45 extends between terminal portions 43 of grooves 37 and the inner surface of body 6. Sintered powder 30 may be selected from any of the materials having high thermal conductivity and that are suitable for fabrication into porous structures, e.g., carbon, tungsten, copper, aluminum, magnesium, nickel, gold, silver, aluminum oxide, beryllium oxide, or the like, and may comprise either substantially spherical, arbitrary or regular polygonal, or filament-shaped particles of varying cross-sectional shape. For example, sintered copper powder 30 is deposited between lands 42 (and on the portion of base 10 that surrounds base-wick 12) such that groove-wick 45 comprises an average thickness of about one to six average copper particle diameters (approximately 0.005 millimeters to 0.5 millimeters, preferably, in the range from about 0.05 millimeters to about 0.25 millimeters) when deposited over substantially all of inner surface 23 of base 10, and in the space between sloped side walls 44a, 44b at the bottom of lands 42. Of course, other wick materials, such as, aluminum-silicon-carbide or copper-silicon-carbide may be used with similar effect.

Significantly groove-wick 45 is formed so as to be thin enough that the conduction delta-T is small enough to prevent boiling from initiating at the interface between inner surface 23 and the sintered powder forming the wick. Groove-wick 45 is an extremely thin wick structure that is fed by spaced lands 42 which provide the required cross-sectional area to maintain effective working fluid flow. In cross-section, groove-wick 45 comprises an optimum design when it comprises the largest possible (limited by capillary limitations) flat area between lands 42. This area should have a thickness of, e.g., only one to six copper powder particles. The thinner groove-wick 45 is, the better performance within realistic fabrication constraints, as long as the surface area of inner surface 23 has at least one layer of copper particles. This thin wick area takes advantage of the enhanced evaporative surface area of the groove-wick layer, by limiting the thickness of groove-wick 45 to no more than a few powder particles. This structure has been found to circumvent the thermal conduction limitations associated with the prior art.

It is to be understood that the present invention is by no means limited only to the particular constructions herein disclosed and shown in the drawings, but also comprises any modifications or equivalents within the scope of the claims.

What is claimed is:

1. A tower heat pipe comprising:
    a tube having an internal surface at least partially covered with a wick, a working fluid disposed within said tube, a sealed first end, and at least one fin projecting radially outwardly from an outer surface of said tube;
    a base sealingly fixed to a second end of said tube, and having a grooved sintered wick disposed on at least a portion of an internal surface;
    said grooved sintered wick comprising a plurality of individual particles which together yield an average particle diameter, and including at least two lands that are in fluid communication with one another through a particle layer disposed between said at least two lands wherein said particle layer comprises at least one dimension that is no more than about six average particle diameters.

2. A tower heat pipe according to claim 1 wherein said particle layer comprises a thickness that is about three average particle diameters.

3. A tower heat pipe according to claim 1 wherein said particles are formed substantially of copper.

4. A tower heat pipe according to claim 1 wherein said six average particle diameters is within a range from about 0.05 millimeters to about 0.25 millimeters.

5. A heat pipe comprising:

a tubular enclosure having an internal surface covered by a wick and sealed at a first end;

a base sealing fixed to a second end of said enclosure so as to form an internal surface within said enclosure;

a working fluid disposed within said enclosure;

at least one fin projecting radially outwardly from an outer surface of said tubular enclosure; and a grooved sintered wick disposed upon said internal surface formed by said base, said grooved sintered wick comprising a plurality of individual particles which together yield an average particle diameter, and including at least two lands that are in fluid communication with one another through a particle layer disposed between said at least two lands wherein said particle layer comprises at least one dimension that is no more than about six average particle diameters.

6. A heat pipe according to claim 5 wherein said particle layer comprises a thickness that is less than about three average particle diameters.

7. A heat pipe according to claim 5 wherein said particles are formed substantially of copper.

8. A heat pipe according to claim 5 wherein six average particle diameters is within a range from about 0.005 millimeters to about 0.5 millimeters.

9. A heat pipe according to claim 5 wherein said particle layer extends between a terminal portion of said lands and adjacent portions of said enclosure on said internal surface.

10. A heat pipe according to claim 5 wherein said particle layer is formed from a material selected from the group consisting of carbon, tungsten, copper, aluminum, magnesium, nickel, gold, silver, aluminum oxide, and beryllium oxide.

11. A tower heat pipe comprising:

a tube having an internal surface, a working fluid disposed within said tube, a sealed first end, and at least one fin projecting radially outwardly from an outer surface of said tube;

a base sealingly fixed to a second end of said tube, and having a grooved sintered wick disposed on at least a portion of an internal surface;

said grooved sintered wick comprising a plurality of individual particles which together yield an average particle diameter, and including at least two lands that are in fluid communication with one another through a particle layer disposed between said at least two lands wherein said particle layer comprises at least one dimension that is no more than about six average particle diameters.

* * * * *

UNITED STATES PATENT AND TRADEMARK OFFICE
CERTIFICATE OF CORRECTION

PATENT NO. : 6,938,680 B2  Page 1 of 1
DATED : September 6, 2005
INVENTOR(S) : Garner et al.

It is certified that error appears in the above-identified patent and that said Letters Patent is hereby corrected as shown below:

Column 5,
Line 16, delete "sealing" and insert -- sealingly --.

Signed and Sealed this

Twenty-ninth Day of November, 2005

JON W. DUDAS
*Director of the United States Patent and Trademark Office*